(12) United States Patent
Keil

(10) Patent No.: US 6,268,260 B1
(45) Date of Patent: Jul. 31, 2001

(54) METHODS OF FORMING MEMORY CELL CAPACITOR PLATES IN MEMORY CELL CAPACITOR STRUCTURES

(75) Inventor: Douglas L. Keil, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/281,866

(22) Filed: Mar. 31, 1999

(51) Int. Cl.[7] .................................................. H01L 21/20
(52) U.S. Cl. .............................. 438/396; 438/3; 438/240
(58) Field of Search ........................... 438/3, 240, 396, 438/398, 253, 254, 255, 397

(56) References Cited

U.S. PATENT DOCUMENTS

| | | | |
|---|---|---|---|
| 5,142,437 | 8/1992 | Kammerdiner et al. | 361/313 |
| 5,283,201 | 2/1994 | Tsang et al. | . |
| 5,293,510 | 3/1994 | Takenaka | 257/295 |
| 5,366,920 | 11/1994 | Yamamichi et al. | . |
| 5,392,189 | 2/1995 | Fazan et al. | 361/305 |
| 5,504,041 | * 4/1996 | Summerfelt | . |
| 5,633,188 | * 5/1997 | Ogawa | 438/396 |
| 5,789,320 | 8/1998 | Andricacos et al. | 438/678 |
| 5,801,916 | 9/1998 | New | 361/321.4 |
| 5,808,854 | 9/1998 | Figura et al. | 361/321.4 |
| 6,001,660 | * 12/1999 | Park et al. | 438/3 |

FOREIGN PATENT DOCUMENTS

| | | | |
|---|---|---|---|
| 0834912 | 4/1998 | (EP) | H01L/32/05 |

OTHER PUBLICATIONS

International Search Report, Nov. 15, 2000, EPO.
Kotecki, "High–K Dielectric Materials For DRAM Capacitors", Nov. 1996, Semiconductor Internation, pp. 109–116.

Dax, "The Non–Volatile Memory Challenge", Sep. 1997, Semiconductor International, pp. 84–92.

DeOrnellas, et al., "Plasma Etch of Ferroelectric Capacitors in FeRAMs and DRAMs", Sep. 1997, Semiconductor International, pp. 103–106.

Cataldo, "DRAM players find new allies for 1–Gbit", Dec. 7, 1998, Electronic Engineering Times, pp. 1, 168, & 17? .

Yoo, et al., "Control of Etch Slope during Etching of Pt in $Ar/Cl_2/O_2$ Plasmas", Apr. 1996, (Journal unknown) Part 1, No. 4B, pp. 2501–2504.

Scott, et al., "Ferroelectric Memories", Dec. 1989, Science, vol. 246, pp. 1400–1405.

Jones, "Integration of ferroelectric nonvolatile memories", Oct. 1997, Solid State Technology, pp. 201–210.

(List continued on next page.)

*Primary Examiner*—Tuan H. Nguyen
(74) *Attorney, Agent, or Firm*—Beyer Weaver & Thomas, LLP

(57) ABSTRACT

An improved method of forming a memory cell capacitor plate is disclosed. The method of forming a memory cell capacitor plate comprises the steps of depositing a sacrificial layer and forming an opening in the sacrificial layer. Then an electrode material layer which includes a substantially conductive material that remains substantially conductive upon exposure to oxygen is deposited over a top surface of the sacrificial layer and at least partially filling the opening. The method continues with removing a portion of the electrode material layer down to at least about a level of the sacrificial layer's top surface to define a top surface of the memory cell capacitor plate, followed by removal of the sacrificial layer.

12 Claims, 6 Drawing Sheets

OTHER PUBLICATIONS

Cofer, et al., "Plasma Etch Processing Of Ferroelectric Capacitors", 1996 $22^{nd}$ Tegal Plasma Seminar, pp. 127–135.

Nishioka, et al., "Giga–bit Scale DRAM Cell with New Simple Ru/(Ba,Sr)TiO$_3$/Ru Stacked Capacitors Using X–0ray Lithography", 1995 IEEE, IEDM, pp. 903–906.

Yuuki, et al., "Novel Stacked Capacitor Technology for 1 Gbit DRAMS with CVD–(Ba,Sr)TiO$_3$ Thin Films on a Thick Storage Node of Ru", pp. 115–118.

Keil, et al., "The Etching of Platinum Electrodes for PZT Based Ferroelectric Devices", 1996, Plasma Processing ($11^{th}$ International Symposium), pp. 1–7.

Cofer, et al., "Plasma Etch Processing of Advanced Ferroelectric Devices," Mar. 1996, Proceedings of $8^{th}$ Internation Symposium on Integrated Ferroelectrics, pp. 1–9.

Yoo, et al., "Control of the pattern slope in Ar/C1$_2$/O$_2$ plasmas during etching of Pt", 1995 Dry Process Symposium, pp. 191–194.

* cited by examiner

METHODS OF FORMING MEMORY CELL CAPACITOR PLATES IN MEMORY CELL CAPACITOR STRUCTURES

BACKGROUND OF THE INVENTION

The present invention relates to semiconductor devices and more particularly, to improved methods of forming memory cell capacitor plates from materials that do not form insulators upon exposure to oxygen. Materials with such properties might include oxygen-resistant materials, conductive materials that form conductive oxides upon exposure to oxygen, or the conductive oxides themselves for use in memory cell capacitor devices.

Semiconductor manufacturers must continually improve the power and performance of semiconductor devices while keeping the device size to a minimum. In an effort to maintain a small device size in the manufacture of integrated circuit devices such as memory cells and memory cell capacitor structures, most semiconductor manufacturers reduce individual components of the memory device to minimal dimensions. To accomplish that purpose, manufacturers are turning to different material alternatives having the desired characteristics that would reduce the device area consumed by the components. However, new problems arise as traditional manufacturing processes are applied to these new materials. For example, ferroelectric materials offer advantageous characteristics such as high dielectric constants, remnant polarization, and low coercive voltages, which make the use of these materials increasingly attractive in the semiconductor industry.

An illustrative example can be found in DRAM applications, where the high dielectric constants of ferroelectric materials allow for increased capacitance per cell volume. This translates into a DRAM cell size reduction by as much as a factor of 20 in comparison with DRAM cells presently in use that employ silicon nitride or silicon oxide dielectrics. Moreover, the remnant polarization allows for the storage of states, much like the storage of states in a magnetic domain of, for example, a ferromagnetic material. This polarization characteristic of ferroelectric materials permits information to be stored indefinitely as in magnetic materials, without the need to provide an applied field or voltage to maintain that memory. This makes ferroelectric materials an excellent material choice for manufacturing nonvolatile memory arrays. Furthermore, the low coercive voltages exhibited by ferroelectric materials advantageously allow these nonvolatile memory arrays to switch states, among other modes of operation, using standard supply voltages, for example, between about 3 and about 5 volts.

Ferroelectric materials generally require high processing temperatures to achieve the desired crystal structure that will provide the preferred characteristics, and the formation of the ferroelectric phase depends on the availability of oxygen. Therefore, ferroelectric materials are generally deposited in an oxygen-containing environment, which might result in incompatibility between ferroelectric materials and the conductive materials used within the same device. By way of example, a capacitor structure might have a capacitor storage element made of ferroelectric materials and capacitor plates made of a conductive metal. The oxygen present in the deposition environment of ferroelectrics may very well form an oxide with the conductive metal used to form capacitor plates. And since most oxides have an insulating effect, this would drastically impact the capacitor properties in a detrimental manner by cutting off electrical contact at the interface where the oxide is formed. The oxygen atmosphere processing of the ferroelectric film places stringent materials requirements on the capacitor plates, which generally should be made of materials that are substantially nonreactive with oxygen. Materials that could be used compatibly with ferroelectrics might include oxygen-resistant materials, conductive materials that form conductive oxides, or the conductive oxides themselves for use in memory cell capacitor devices. Examples of these materials might include, but are not limited to, platinum, ruthenium, ruthenium oxide, iridium, and iridium oxide. However, these unconventional materials do not lend themselves well to traditional plasma etching techniques.

By way of example, platinum is a relatively chemically inert material that does not respond very well to etching. FIG. 1 depicts an etched platinum-containing layer 100 which illustrates the problems encountered in the etching of platinum. Platinum-containing layer 100 has been sputter etched to form the desired structure, often with a noble gas such as argon. The sputtering displaces some platinum ions, which tend not to land on the chamber walls, but instead, hit the sidewalls 102 and redeposit upon the platinum-containing layer 100. Upon removal of a photoresist mask previously disposed over platinum-containing layer 100, fang-like structures which are commonly termed as veils 104 are formed. These structures may also be referred to as redeposit, fences, crowns, and ears, among others. The prominence of veils 104 relates inversely with the tapering angle of platinum-containing layer 100, that is, the more vertical the profile, the more prominent the veils. However, excessive taper angles that would avoid veil formation would also result in lower packing densities, which would be inefficient and therefore not be feasible in these applications.

There are many disadvantages with this particular aspect of platinum etching. Veils 104, which protrude above the top surface of platinum-containing layer 100, do not allow for a flat surface upon which subsequent layers may be deposited. Moreover, the fang-like structure of veils 104 provide sharp points on the structure, that are areas that could possibly generate very high electric fields even with extremely small voltages, which has a very high potential for breaking down. The preferred configuration would probably be a mesa structure that would have steep profile angles, i.e., more vertical profiles, to allow a more compact packing density, yet would have no sharp protrusions that might cause device failure.

Therefore, there are desired improved methods that allow for the manufacture of capacitor plates made from materials that do not react with oxygen to form insulators while avoiding the aforementioned problems associated with etching these materials.

SUMMARY OF THE INVENTION

To achieve the foregoing and other objects and according to the purpose of the present invention, improved methods of forming memory cell capacitor plates and memory cell capacitor structures are disclosed. In one embodiment of the invention, a method of forming a memory cell capacitor plate is disclosed. This method begins with the deposition of a sacrificial layer followed by the forming of an opening in the sacrificial layer. Then an electrode material layer which includes a substantially conductive material that remains substantially conductive upon exposure to oxygen is deposited over a top surface of the sacrificial layer and at least partially filling the opening. The method continues with removing a portion of the electrode material layer down to at least about a level of the top surface of the sacrificial layer to define a top surface of the memory cell capacitor plate, followed by removal of the sacrificial layer.

In another embodiment of the present invention, a method of forming a platinum-containing memory cell capacitor plate is disclosed. The method begins with the deposition of a sacrificial layer, followed by the forming of an opening in the sacrificial layer. Then a platinum-containing layer is deposited over a top surface of the sacrificial layer and at least partially filling the opening. The method continues with the removal of a portion of the platinum-containing layer down to at least about a level of the top surface of the sacrificial layer to define a top surface of the platinum-containing memory cell capacitor plate, followed by the removal of the sacrificial layer.

In yet another embodiment of the present invention, a method of forming a memory cell capacitor structure is disclosed. The method begins with the deposition of a first sacrificial layer, followed by the forming of a first opening in the first sacrificial layer. Then a first electrode material layer which includes a substantially conductive material that remains substantially conductive upon exposure to oxygen is deposited over a top surface of the first sacrificial layer and at least partially filling the first opening, followed by the removal of a portion of the first electrode material layer down to at least about a level of the top surface of the first sacrificial layer to define a top surface of a first memory cell capacitor plate. The method continues with the deposition of a second sacrificial layer, followed by the forming of a second opening in the second sacrificial layer. Then a dielectric layer is deposited over a top surface of the second sacrificial layer and at least partially filling the second opening, this dielectric layer having electrical contact with the first memory cell capacitor plate. The method further includes removing a portion of the dielectric layer down to at least about a level of the top surface of the second sacrificial layer to define a top surface of a memory cell capacitor storage element, followed by the removal of first and second sacrificial layers. A second memory cell capacitor plate is then formed over the memory cell capacitor storage element.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE PREFERRED EMBODIMENTS

Figure 1:
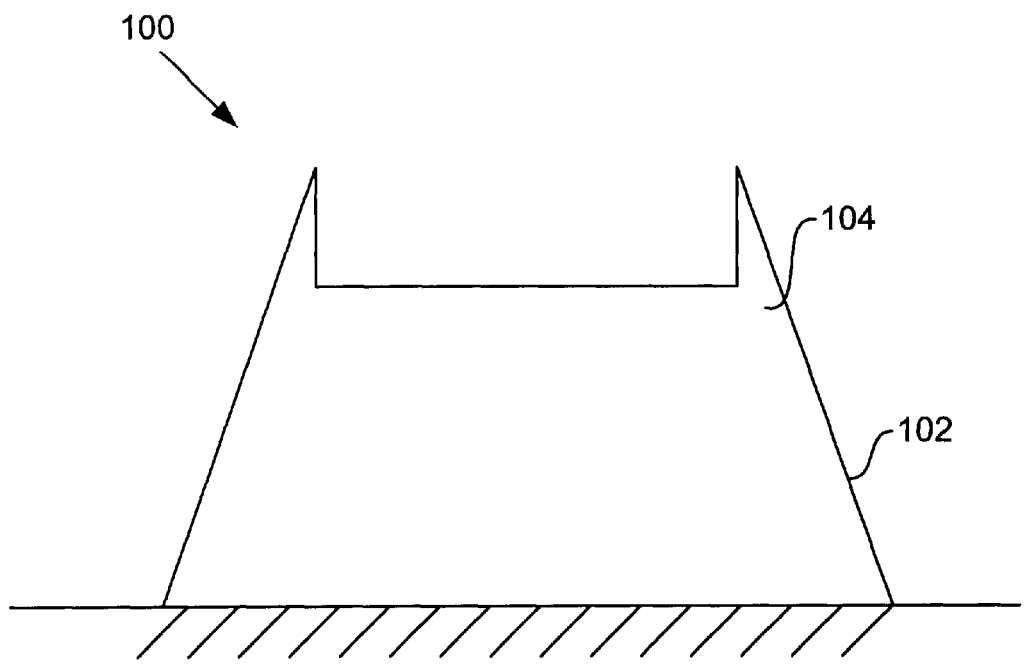
FIG. 1 depicts an etched platinum-containing layer which illustrates the problems encountered in the etching of platinum.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The invention relates to improved methods of forming memory cell capacitor plates in memory cell capacitor structures using conductive materials which do not form insulators upon exposure to oxygen. These improved methods do not involve etching of these materials, in fact, the proposed approach to forming these components involves etch and mask sequences generally known in the art as damascene techniques. The damascene technique involves forming a plurality of openings in a layer of insulator and subsequently filling them with, for example, platinum, which is then polished down to the surface of the insulator to form the desired metal pattern.

According to the invention, a capacitor plate made of a substantially conductive material that remains substantially conductive upon exposure to oxygen is formed by adapting damascene techniques to process the material in order to avoid the difficulties of etching such chemically resistant materials. In one embodiment of the invention, a sacrificial layer is formed by a deposition process, followed by the forming of an opening in the sacrificial layer. An electrode material layer which includes a substantially conductive material that remains substantially conductive upon exposure to oxygen is deposited over a top surface of the sacrificial layer and at least partially filling the opening. Subsequently, a portion of the electrode material layer is removed down to at least about a level of the top surface of the sacrificial layer to define a top surface of the memory cell capacitor plate. Then the sacrificial layer is removed to reveal a substantially conductive memory cell capacitor plate.

In another embodiment of the present invention, a sacrificial layer is formed by a deposition process, followed by the forming of an opening in the sacrificial layer. A platinum-containing layer is deposited over a top surface of the sacrificial layer and at least partially filling the opening. Thereafter, a portion of the platinum-containing layer is removed down to at least about a level of the top surface of the sacrificial layer to define a top surface of the platinum-containing memory cell capacitor plate. Then the sacrificial layer is removed to reveal a platinum-containing memory cell capacitor plate.

In yet another embodiment of the present invention, a first sacrificial layer is formed by a deposition method, followed by the forming of a first opening in the first sacrificial layer. A first electrode material layer which includes a substantially conductive material that remains substantially conductive upon exposure to oxygen is deposited over a top surface of the first sacrificial layer and at least partially filling the first opening. Subsequently, a portion of the first electrode material layer is removed down to at least about a level of the top surface of the first sacrificial layer to define a top surface of a first memory cell capacitor plate. A second sacrificial layer is then deposited over the top surface of the first memory cell capacitor plate, followed by the forming of a second opening in the second sacrificial layer. Then a dielectric layer is deposited over a top surface of the second sacrificial layer and at least partially filling the second opening in such a way that enables this dielectric layer to maintain electrical contact with the first memory cell capacitor plate. Thereafter, a portion of the dielectric layer is removed down to at least about a level of the top surface of the second sacrificial layer to define a top surface of a memory cell capacitor storage element, followed by the removal of first and second sacrificial layers. A second memory cell capacitor plate is then formed over the memory cell capacitor storage element to complete the memory cell capacitor structure.

Figure 2:
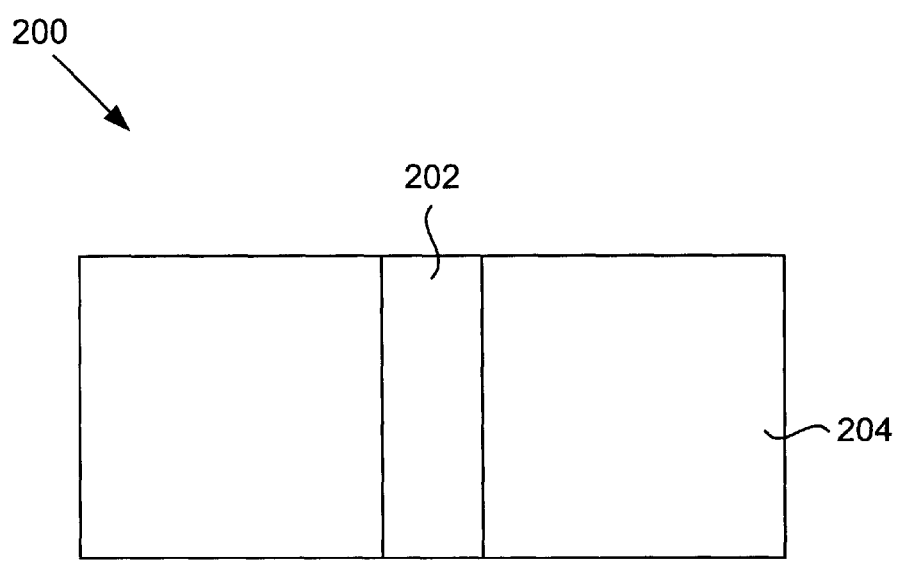
FIG. 2 illustrates an exemplary substrate having a conductive plug that may be used as a basis for fabricating a memory cell capacitor plate.

To facilitate discussion, FIG. 2 illustrates an exemplary substrate 200 which may be, by way of example, a memory cell having a plug 202, that may be used as a foundation for fabricating a memory cell capacitor plate. Plug 202 may be formed of a conductive material such as polysilicon, tungsten or aluminum, and may provide electrical contact with a contiguous memory cell capacitor. Plug 202 is surrounded by an insulating layer 204, which may be formed of an oxide or other dielectric materials. It should also be noted that the devices of the figures shown herein are depicted in a simplified format for illustration purposes only. There may be present other additional layers above, below, or in between the layers shown. Further, not all of the shown layers need necessarily be present and some or all may be substituted by other different layers. The layers of the devices shown and discussed herein are readily recognizable to those skilled in the art and may be formed using any of a number of suitable and known deposition processes, including chemical vapor deposition (CVD), plasma-enhanced chemical vapor deposition (PECVD), and a physical vapor deposition (PVD), such as sputtering.

Figure 3:
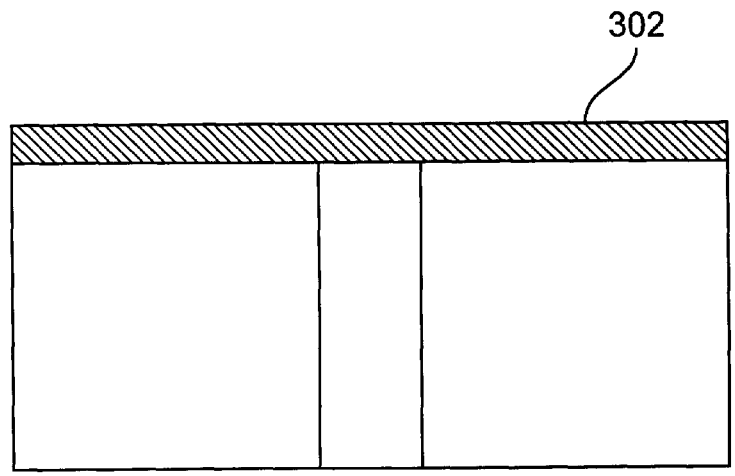
FIG. 3 illustrates an optional boundary layer disposed above the exemplary substrate shown in FIG. 2.

FIG. 3 illustrates an optional boundary layer 302 disposed above the exemplary substrate 200 of FIG. 2. Boundary layer 302 may be formed of, by way of example, titanium nitride or silicon nitride, and may function as an etch stop layer during the removal of a layer disposed above it. As an etch stop layer, its purpose is to ensure uniformity in the etching depth and to keep the underlying layer intact.

Alternatively, boundary layer 302 may also serve as a diffusion barrier layer. Certain materials, such as platinum by way of example, may be resistant to any chemical reaction with oxygen, yet be permeable to oxygen. By way of example, suppose a capacitor having platinum-containing capacitor plates and a ferroelectric storage element between these plates is disposed above substrate 200. Since platinum is permeable to oxygen, the oxygen in the ferroelectric material may diffuse through the platinum-containing capacitor plate and react with conductive plug 202 to form an oxide interface between conductive plug 202 and the platinum-containing capacitor plate. The oxide, which most likely is an insulator, will break off electrical contact between plug 202 and the platinum-containing capacitor plate adjacent to it. The formation of this oxide in effect terminates the electrical contact between the memory cell and the memory cell capacitor. The presence of boundary layer 302 to function as a diffusion barrier layer would prevent the oxygen in the ferroelectric material from diffusing into the platinum, which in turn would prevent the formation of the insulating oxide.

However, in spite of its many functions, boundary layer 302 is an optional layer that is not essential to the invention. In certain situations, for example, where the plug material used is hard to etch, and does not have the potential to form an insulating oxide, such a boundary layer would not be necessary.

Figure 4:
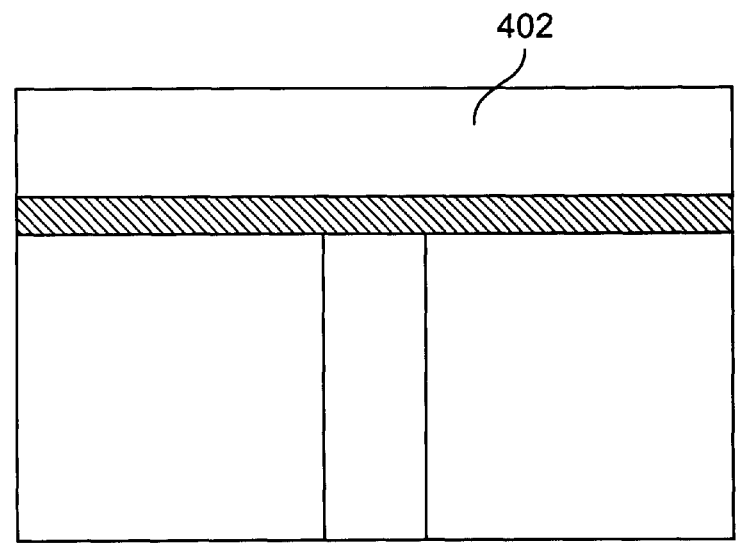
FIGS. 4–8 illustrate a process flow for forming an exemplary memory cell capacitor plate disposed above the structure of FIG. 3 according to a first embodiment of the present invention.
Figure 5:
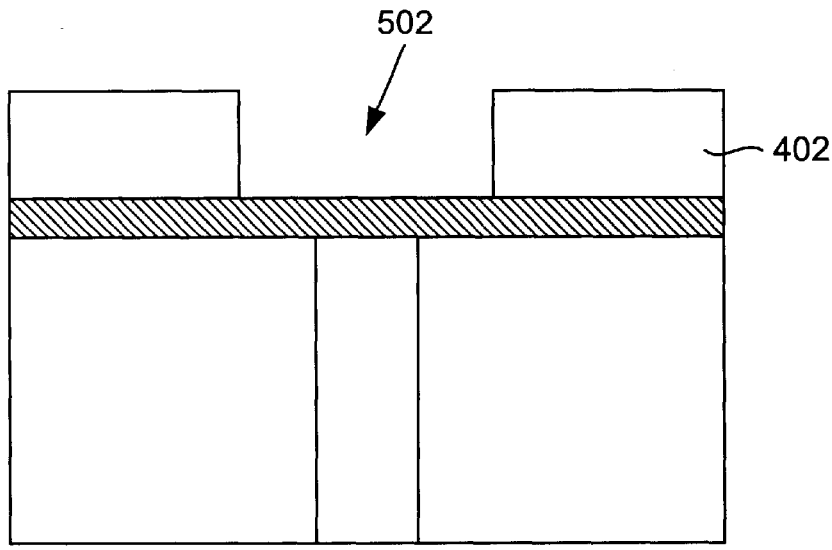

In FIG. 4, a sacrificial layer 402 is deposited over boundary layer 302. Sacrificial layer 402 may be formed from an oxide, by way of example. This step is followed by the forming of an opening 502 in sacrificial layer 402, as shown in FIG. 5. Opening 502 may be formed by patterning and etching sacrificial layer 402, which is believed to be a cleaner and less work-intensive process than patterning and etching metal.

Figure 6:
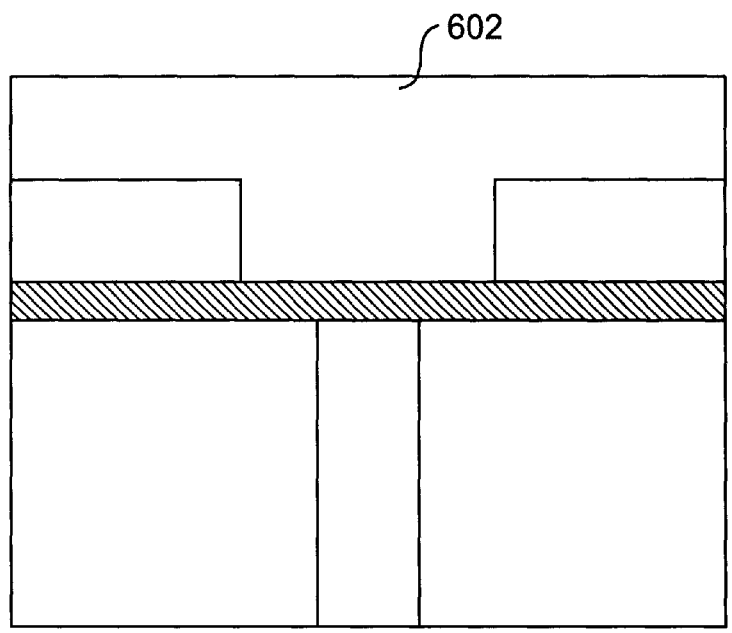
Figure 7:
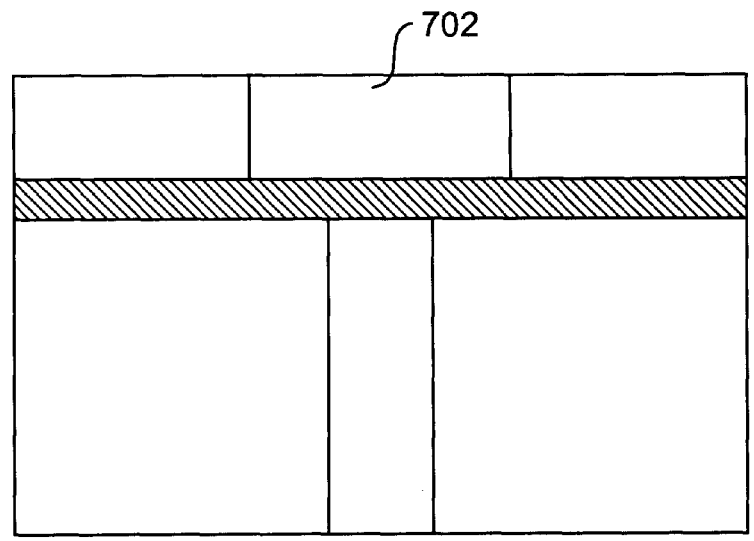

FIG. 6 illustrates the resulting structure after an electrode material such as platinum has been deposited over sacrificial layer 402 and at least partially filling opening 502 to form an electrode material layer 602. A portion of electrode material layer 702 is then removed down to at least about a level of a top surface of sacrificial layer 402 to define a top surface of the memory cell capacitor plate 702, as shown in FIG. 7. Removal of an electrode material material such as platinum may be accomplished by a planarizing method such as chemical mechanical polishing (CMP). Subsequently, sacrificial layer 402 is removed to isolate memory cell capacitor plate 702 as shown in FIG. 8.

Figure 8:
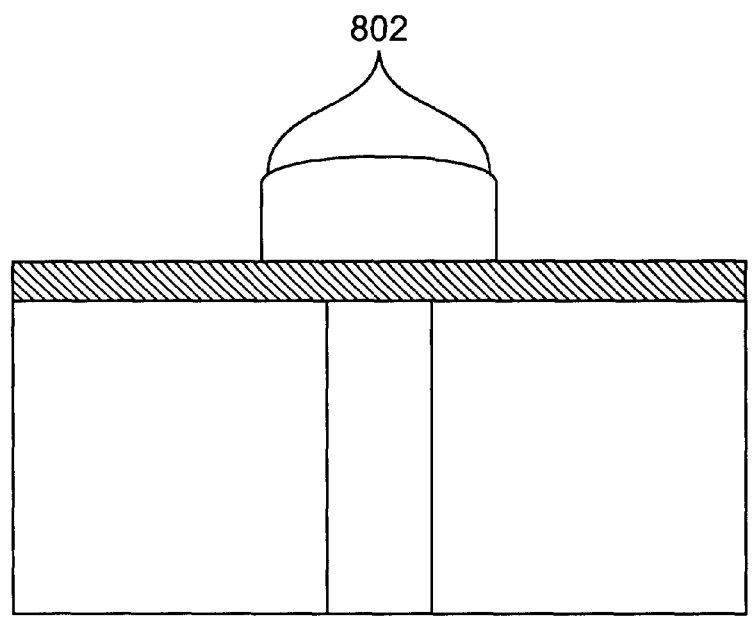

FIG. 8 shows memory cell capacitor plate 702 having sharp corners 802, which may generate strong electric fields in a concentrated area that in turn might result in short circuits and device failure. To prevent this situation from occurring, an additional step to round out these sharp corners would be advantageous in achieving the manufacture of a more reliable device. The rounding of sharp corners may be achieved by, for example, a sputter process, or a plasma etch. These processes may also achieve the additional purpose of removing the sacrificial layer, which would optimize the inventive method by minimizing the number of steps needed to implement this invention.

Figure 9:
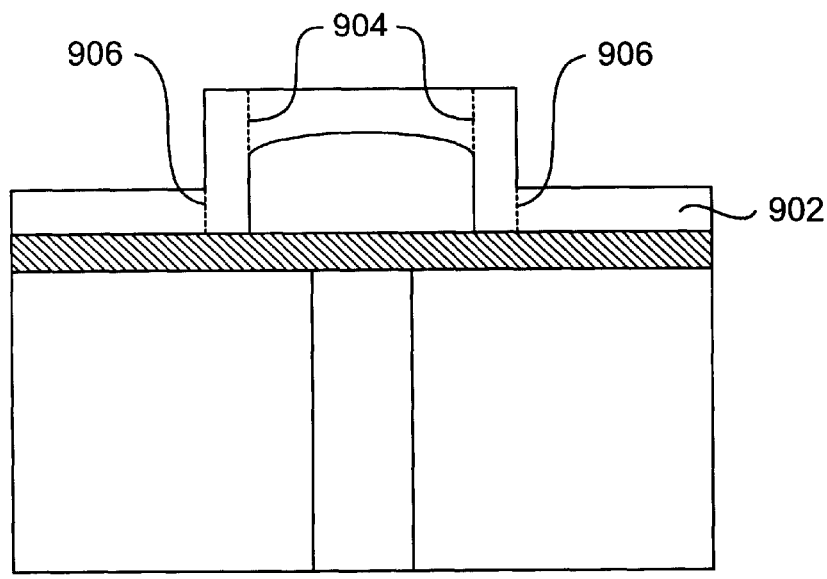
FIGS. 9–10 illustrate a process flow that continues the process flow illustrated in FIGS. 4–8 to complete the fabrication of an exemplary memory cell capacitor structure as shown in its completed form in FIG. 10 according to a second embodiment of the present invention.

In FIG. 9, a ferroelectric layer 902 is conformally deposited over memory cell capacitor plate 702 and the underlying substrate that has been exposed by the removal of sacrificial layer 402. Ferroelectric material may be deposited by a wide variety of technologies such as metal chemical vapor deposition (Metal CVD), metal ion plasma etching, etc.

The ferroelectric layer serves as a component for capacitance storage and may be created in several alternative forms. It may be formed by conformal deposition as previously shown, or it may be formed by the same inventive method used for forming the memory cell capacitor plate, in which case, the sidewalls of the corresponding ferroelectric layer would be defined by lines 904. Alternatively, the ferroelectric layer might be formed by conformal deposition of the ferroelectric layer, followed by removal of ferroelectric material that do not lie within a given distance from the contact surface of underlying memory cell capacitor plate 702, in which case the sidewalls of this corresponding ferroelectric layer would be defined by lines 906. Removal of designated portions of the ferroelectric layer may be accomplished by patterning it with a masking material and etching away these designated portions.

To achieve higher capacitance, it would be more advantageous to have ferroelectric layer 902 cover the sidewalls of the underlying memory cell capacitor plate 702, especially given that sidewalls contribute about 50% of the capacitance. This is due to the fact that the aspect ratio of such capacitor structures is extremely high, and the sidewalls could make up about two-thirds of the contact area of the entire structure. Since capacitance may be increased by maximizing contact between the surface areas of the capacitor plate and the capacitor storage elements, ferroelectric layers such as the conformally deposited ferroelectric layer 902 that cover the sidewalls of memory cell capacitor plate 702 would probably be one of the more advantageous embodiments for achieving an increase in capacitance.

Figure 10:
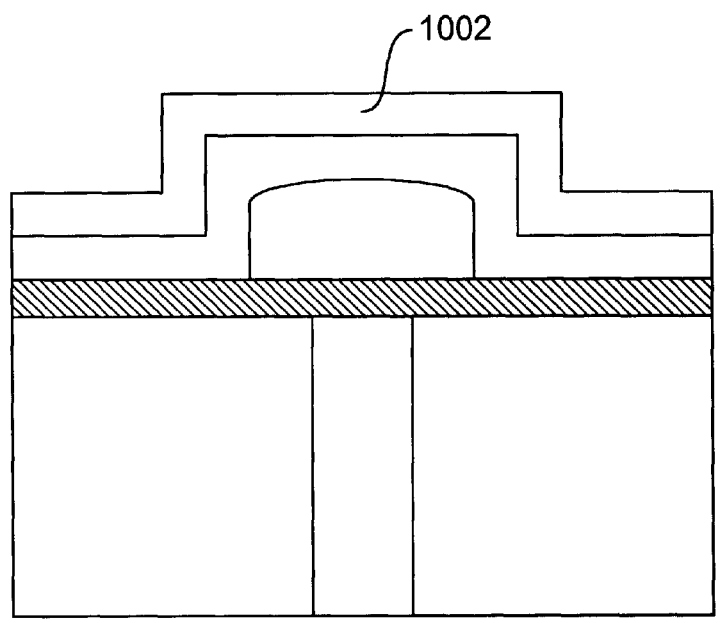
Figure 11:
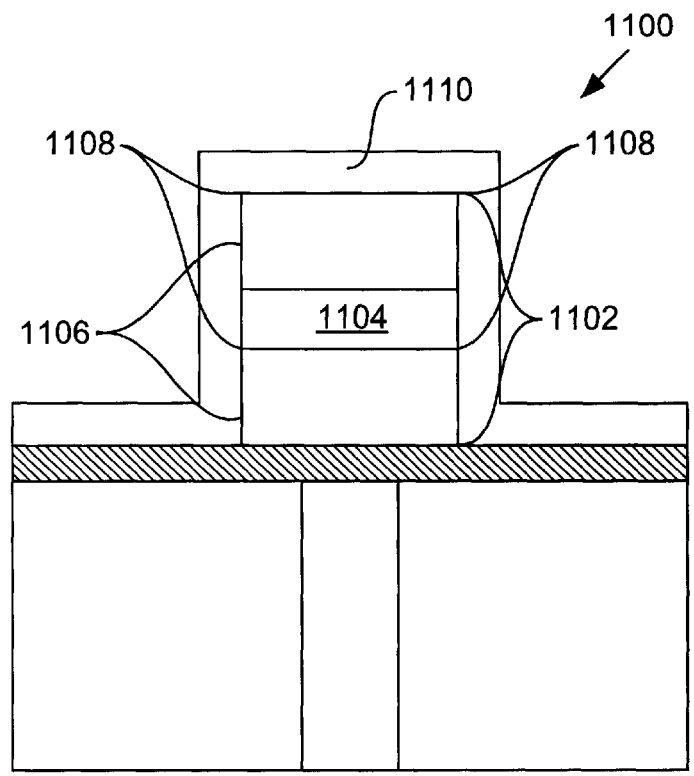
FIGS. 11 and 12 show other exemplary memory cell capacitor structures that was fabricated in accordance with alternative embodiments of the present invention.
Figure 12:
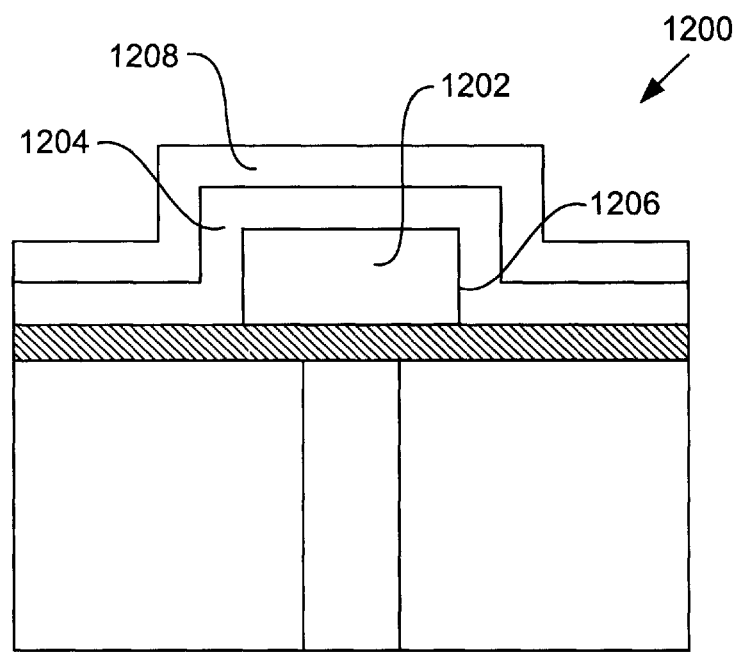

In FIG. 10, an electrode material layer 1002 is conformally deposited over ferroelectric layer 902 to form a second memory cell capacitor plate that completes the entire capacitor structure. The exemplary memory cell capacitor structure shown in FIG. 10 is constructed by forming the lower memory cell capacitor plate 702 using the method described in this invention, followed by conformal depositions of ferroelectric layer 902 and electrode material layer 1002 in succession. Alternatively, this second memory cell capacitor plate may also be formed using the inventive method. FIGS. 11 and 12 depict other exemplary memory cell capacitor structures that were fabricated in accordance with alternative embodiments of the present invention.

FIG. 11 shows a capacitor 1100 wherein each capacitor plate as well as the capacitor storage element is fabricated using the inventive method for fabricating an individual capacitor plate. A minor modification is made to the inventive method, that is, the removal of each sacrificial layer is not performed right after the component enveloped by that sacrificial layer has been created, in fact, removal of all the sacrificial layers is postponed until all components of the capacitor structure has been formed. The end result in this instance is a sandwich structure having a ferroelectric layer 1104 sandwiched between platinum layers 1106. The sharp comers 1108 of each platinum layer 1106 may also be rounded as it is formed by the methods described earlier for rounding the sharp comers of the first memory cell capacitor plate 702 as presented in FIG. 8. Capacitor 1100 is encapsulated by an optional capping layer 1110, which may also be used with other capacitor structures to provide a protective barrier function that prevents capacitor 1100 from interacting with the air, moisture, or other impurities in the environment.

FIG. 12 depicts a capacitor 1200 having a platinum capacitor plate 1202 fabricated in accordance with the inventive method. A ferroelectric layer 1204 is then conformally deposited over platinum-containing capacitor plate 1202, followed by removal of the portions of ferroelectric layer 1204 that do not lie within a given distance from the contact surface of platinum capacitor plate 1202. This allows for the maximizing of capacitance storage by allowing ferroelectric layer 1204 to come in contact with the sidewalls 1206 of platinum-containing capacitor plate 1202. Subsequently, a platinum-containing layer 1208 is conformally deposited over what is left of the ferroelectric layer 1204 to form a completed capacitor structure. An optional capping layer may be deposited over platinum-containing layer 1206 to provide a protective barrier, but is not shown in the illustration for the sake of simplifying the discussion.

As can be appreciated from the foregoing, the invention advantageously provides methods for forming capacitor plates made of materials that remain conductive after exposure to oxide such as platinum by taking a damascene approach. For example, materials such as ruthenium, iridium and their oxides can form toxic substances that can be harmful when they are in a volatile state. By utilizing a damascene approach that emphasizes the patterning of these materials by etching of a sacrificial layer, the creation of volatile states of these substances can be restricted to the deposition steps only, thus reducing opportunities for operator exposure to these substances. Moreover, the inventive method advantageously leverages oxide etching, which is a clean and technologically advanced process that has been developed over many years. Alternatively, if these materials, namely, ruthenium, iridium, and their oxides were to be formed into capacitor plates by directly etching these materials, higher process temperatures may be necessary to volatize the etch products of these materials. These higher temperatures might then limit integration options and/or enhance risk of damage to previously fabricated structures. The inventive method as applied to materials such as ruthenium, iridium and their oxides eliminates such concerns.

In another example, the invention allows a platinum-containing plate to be formed using damascene techniques. The use of damascene in forming platinum-containing structures is counterintuitive because platinum is considered to be more difficult to deposit and to CMP in comparison with a more conventionally used material such as copper. In fact, one may even wish to avoid the use of platinum due to the low resistivity and nonvolatility that makes it a very difficult material to work with. However, some of what are considered to be detrimental qualities are precisely the characteristics that make materials such as platinum compatible with the use of unique dielectric materials such as ferroelectrics.

Another advantage of this invention is how it eliminates the need to etch the conductive plate material, and instead, applies the etching process to a sacrificial layer, which may very likely be made of oxide. The etching of materials such as oxides is a cleaner process in comparison with etching a conductive material such as platinum, which might very likely result in decreased deposition of non-volatile and perhaps toxic by-products during the etching process that in turn might require less hazardous, less frequent or less extensive cleanings of the plasma processing chamber. Although chamber cleaning may sound like a trivial process, it is a critical factor in determining the costs of ownership that is reflected in the time and resources expended in cleaning processes.

Although the foregoing invention has been described in some detail for purposes of clarity of understanding, it will be apparent that certain changes and modifications may be practiced within the scope of the appended claims. For example, although this invention has been largely described using a memory cell capacitor structure having platinum-containing plates and a ferroelectric storage element, the invention is not limited to the use of these materials, nor is it limited to the use of memory cell capacitor structures such as those used in DRAM applications. By way of example, the methods of the present invention may also be employed while using alternative materials other than those described in the given examples, as well as in the manufacture of devices other than DRAMs such as smart cards. Accordingly, the present embodiments are to be considered as illustrative and not restrictive, and the invention is not to be limited to the details given herein, but may be modified within the scope and equivalents of the appended claims.

What is claimed is:

1. A method of forming a memory cell capacitor structure, comprising:

depositing a first sacrificial layer over a substrate;

forming a first opening in said first sacrificial layer;

depositing a first electrode material layer over a top surface of said first sacrificial layer completely filling said first opening, wherein said first electrode material layer includes a substantially conductive material that remains substantially conductive upon exposure to oxygen;

removing a portion of said first electrode material layer over down to at least about a level of said top surface of said first sacrificial layer to define a top surface of a first memory cell capacitor plate;

depositing a second sacrificial layer over the top surface of the first memory cell capacitor plate and the first sacrificial layer;

forming a second opening in said second sacrificial layer so that the second opening extends to the first memory cell capacitor plate;

depositing a dielectric layer over a top surface of said second sacrificial layer and at least partially filling said second opening, said dielectric layer having electrical contact with said first memory cell capacitor plate;

removing a portion of said dielectric layer over down to at least about a level of said top surface of said second sacrificial layer to define a top surface of a memory cell capacitor storage element;

removing said second sacrificial layer;

removing said first sacrificial layer; and forming a second memory cell capacitor plate over said memory cell capacitor storage element.

2. The method of claim 1, wherein said substantially oxygen resistant conducting material is one of platinum, ruthenium, ruthenium oxide, iridium, and iridium oxide.

3. The method of claim 1, wherein said second memory cell capacitor plate is formed by conformally depositing a second electrode material layer over said memory cell capacitor storage element, said second electrode material layer including a substantially oxygen resistant conducting material.

4. The method of claim 1, wherein said forming of said second memory cell capacitor plate takes place prior to said removing of said first and said second sacrificial layers, said forming of said second memory cell capacitor plate including:

depositing a third sacrificial layer over the second sacrificial layer and the top surface of a memory cell capacitor storage element;

forming a third opening in said third sacrificial layer;

depositing a second electrode material layer over a top surface of said third sacrificial layer and at least partially filling said third opening, said second electrode material layer including a substantially conductive material that remains substantially conductive upon exposure to oxygen, and said second electrode material layer having electrical contact with said memory cell capacitor storage element;

removing a portion of said second electrode material layer over down to at least about a level of said top surface of said third sacrificial layer to define a top surface of said second memory cell capacitor plate; and removing said third sacrificial layer.

5. The method of claim 1, further comprising: depositing an encapsulating material layer over said memory cell capacitor structure.

6. The method of claim 1, further comprising: depositing a boundary layer over said substrate.

7. The method of claim 6, wherein said boundary layer functions as an etch stop layer.

8. The method of claim 6, wherein said boundary layer functions as a diffusion barrier layer.

9. The method of claim 6, where in said boundary layer includes one of titanium nitride and silicon nitride.

10. The method of claim 1, where in said removing of said portion of said electrode material layer is accomplished by a planarizing process.

11. The method of claim 10, wherein said planarizing process is a chemical mechanical polishing (CMP) process.

12. The method of 1, wherein said dielectric layer includes a ferroelectric material.

* * * * *